United States Patent [19]

Larrowe

[11] Patent Number: 4,663,541
[45] Date of Patent: May 5, 1987

[54] PHASE-SHIFT STABILIZED FREQUENCY MULTIPLIER

[75] Inventor: Vernon L. Larrowe, Ypsilanti, Mich.

[73] Assignee: Environmental Research Institute of Michigan, Ann Arbor, Mich.

[21] Appl. No.: 713,334

[22] Filed: Mar. 18, 1985

[51] Int. Cl.$^4$ ............................................ H03B 19/00
[52] U.S. Cl. .................................. 307/219.1; 328/15; 328/20
[58] Field of Search ............... 307/219.1, 271; 328/55, 328/155, 162, 15, 16, 20, 133

[56] References Cited

U.S. PATENT DOCUMENTS

| | | | |
|---|---|---|---|
| 3,458,823 | 7/1969 | Nordahl | 328/155 |
| 4,066,952 | 1/1978 | Ley | 324/83 D |
| 4,085,362 | 4/1978 | Evans | 324/83 D |
| 4,253,051 | 2/1981 | Schneider | 318/632 |
| 4,307,346 | 12/1981 | Kurosawa et al. | 328/155 |
| 4,321,529 | 3/1982 | Simmonds et al. | 324/83 R |
| 4,425,543 | 1/1984 | Adams et al. | 324/83 R |
| 4,495,468 | 1/1985 | Richards et al. | 328/55 |

*Primary Examiner*—Stanley D. Miller
*Assistant Examiner*—K. Ohralik
*Attorney, Agent, or Firm*—Krass & Young

[57] ABSTRACT

A sinusoidal signal frequency multiplier, including a means for stabilizing the static input-ouput phase relationship. The static phase stabilizer compares the phase relationship between the frequency-multiplied output and the input signals, producing a signal which appropriately controls a phase shifter. This phase shifter operates on the input signal, the result serving as input to the frequency multiplier.

21 Claims, 1 Drawing Figure

PHASE-SHIFT STABILIZED FREQUENCY MULTIPLIER

FIELD OF THE INVENTION

This invention relates to an apparatus for multiplication of sinusoidal frequencies and more particularly to a frequency multiplier ensuring stabilization of static phase shifts.

BACKGROUND OF THE INVENTION

Some signal processing applications dealing with sinusoidal signals require that the frequency of these signals be multiplied by an integer. Although methods for frequency multiplication are well-known, frequency multipliers generally suffer from a phase shift inherent in the frequency multiplication process. Proper design of the frequency multiplier will reduce the noise components of this shift to a level which is much less than the maximum tolerable noise. Some of the phase-shift introduced by a frequency multiplier is, however, static in nature, caused by the changing properties of its electronic components. These properties change very slowly with aging, temperature variations and cycling, and the like.

Perhaps the most obvious method of dealing with this unwanted static phase shift is to provide a manually adjusted phase shifter following the output of the frequency multiplier. This approach to static phase shift stabilization, requiring the intervention of a human being, can be accomplished only relatively infrequently. Furthermore, because they are not done continually, such a compensation scheme can allow a significant phase error to accumulate in the output signal between corrections.

As shown in the preceding discussion, there is a need for an apparatus capable of continually correcting static phase shifts such as those introduced by slow changes in the electronic components of the frequency multiplication system, as well as a frequency multiplier which incorporates such phase-shift stabilization capabilities.

SUMMARY OF THE INVENTION

The present invention broadly concerns the stabilization of long time constant phase noise which is usually associated with aging and temperature variations of the electronic components in a frequency multiplier. The invention compensates for such long time constant changes almost instantaneously. It is automatic and requires no human intervention. A control signal is produced by properly processing the input signal which is the signal to be frequency multiplied and the frequency multiplier output signal, and comparing them. In response to the control signal, an intermediate phase-shifted signal is generated, for inputting to the frequency multiplier. This technique provides the proper input-output phase relationship to correct for static phase shifts.

The phase shift compensation is provided through a feedback path containing a signal-controlled phase shifter. Based on the phase relationship between the input to the frequency multiplier and its output, a control signal is sent to the phase shifter to insure the desired phase stability.

When the frequency of a sinusoidal signal is to be multiplied by a factor which is an integral power of 2, the most common means for doing so is to square the sinusoidal signal, filter it appropriately and remove the resulting bias. This squaring operation produces a sinusoidal signal whose frequency is twice that of the original. By providing a chain of such squaring operations a frequency multiplication factor of any desired integral power of 2 may be obtained.

If the frequency is multiplied by a power of 2 which is greater than or equal to 4, it is observed that when the input signal is making a positively-directed zero crossing, the output signal is at its peak value. In other words, the output signal is ahead of the input signal by a phase shift of 90°. Therefore, by imposing a minus 90° phase shift on the output, the positively-directed zero crossings of the input and output signals can be brought into exact coincidence, except for any phase errors which may have been introduced in the frequency multiplication process.

If the input and output signals are sinusoids, their phase shift can be measured with much greater accuracy by converting them to square waves. Thus, both the output sinusoid and input sinusoid signals are preferably subjected to wave-shaping which produces corresponding square wave trains, the input signal being first subjected to a phase shift which compensates for those inherent unchanging phase errors introduced by this electronic circuit itself. The square wave corresponding to the output sinusoidal signal is subjected to a frequency division, done digitally, by the same power of two as the intended frequency multiplication is done. The result is a square wave whose positive-going leading edges coincide almost exactly with each $2^n$th positive-going zero crossing of the output signal. Any phase difference between these two square waves corresponds to the phase shift error introduced by the frequency multiplier itself. The stability of the phase shift introduced by this form of frequency multiplier is superior to that taught by any of the methods known in the prior art.

Other objectives, advantages and applications of the present invention will be made apparent by the following detailed description of the preferred embodiment of the invention.

DETAILED BRIEF DESCRIPTION OF THE DRAWINGS

In the drawings, which are to be read in conjunction with the specification:

FIG. 1 is a block diagram of the phase shift stabilized frequency multiplier of the present invention.

DETAILED DESCRIPTION OF THE PREFERRED EMBODIMENT

Figure 1:
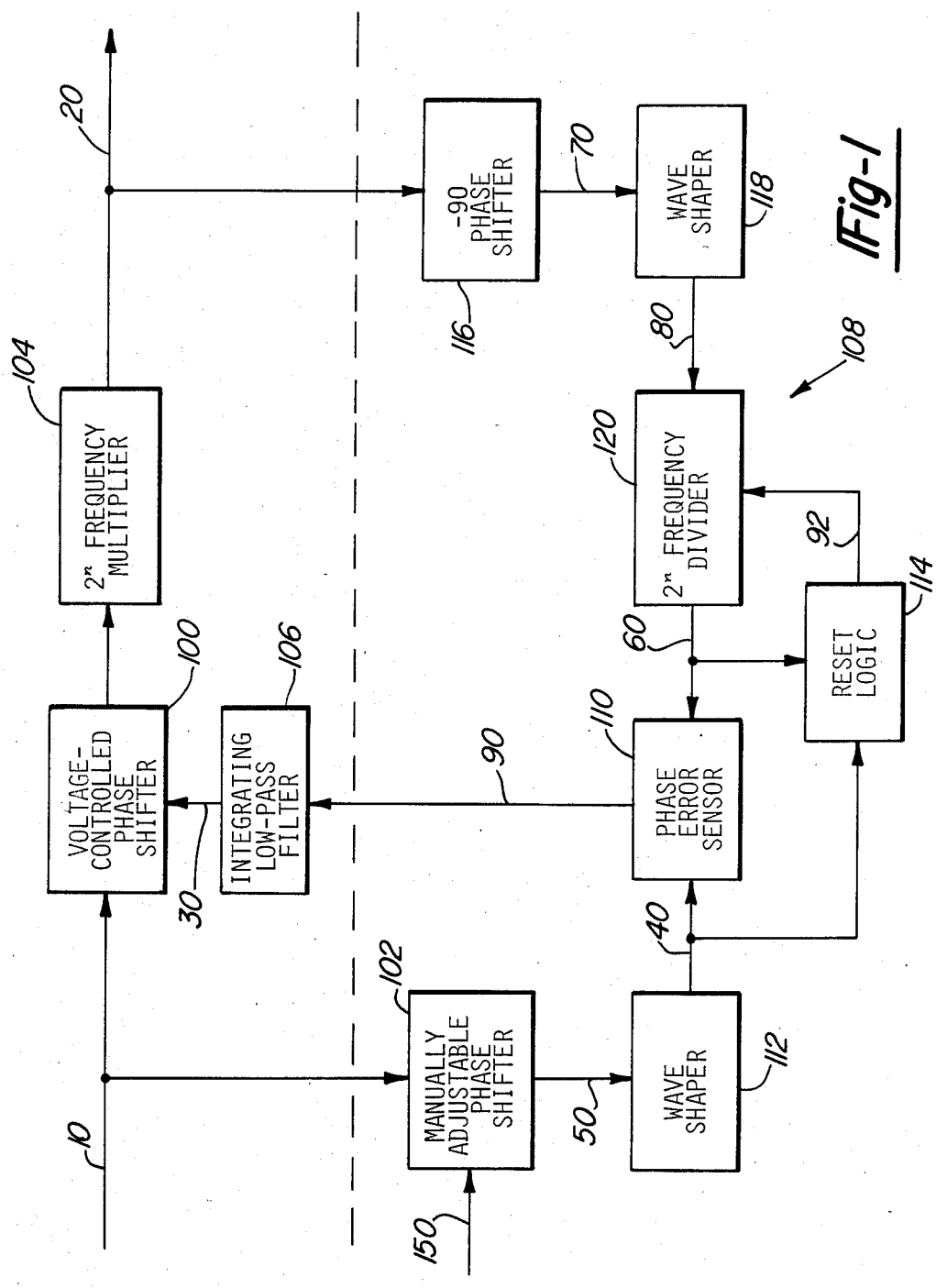

The apparatus illustrated in FIG. 1 is adapted to multiply the frequency of an input sinusoidal signal 10 by a known factor of $2^n$ (for n greater or equal to 2) producing an output sinusoidal signal 20 with a very stable phase shift with respect to input signal 10. Input sinusoid 10 is furnished to both a voltage controlled phase shifter 100 (such as model PSES-3-70, available from Merrimac Industries, W. Caldwell, N.J.) and a manually adjustable phase shifter 102 (model PSL-3-70, Merrimac Industries). The output from phase shifter 100 goes to a frequency multiplier 104 (such as part No. 3818-1007, Trak Microwave Corp., Tampa, Fla.) which produces output sinusoidal signal 20 whose frequency is $2^n$ times greater than the frequency of input signal 10. Stabilization of the phase shift introduced by frequency multiplier 104 is accomplished through phase shifter 100 which responds to a phase control input signal 30 produced by an integrating low pass filter 106 (such as is produced by building an integrating network onto an operational amplifier, such as a Burr-Brown 3551). By integrating the output of the phase error detector, generally designated by 108 as the system below the dotted line on FIG. 1, the input sinusoidal signal 10 is phase-shifted before being input to frequency multiplier 104.

Detector 108 employs a phase error sensor 110 (such as Motorola MC12040 phase-frequency detector) which accepts two trains of square waves: trains 40 and 60 result from processing sinusoidal signals 10 and 20, respectively. Input sinusoid 10 is phase-shifted by the manually adjustable phase shifter 102, which, through manual adjustment 150, accounts for phase shifts introduced through other portions of detector 108. This phase-shifted signal 50 is received by an input wave shaper 112 (such as may be built from a Motorola 1651 clipper) which produces square wave train 40. Square wave train 40 passes to phase error sensor 110, and also to reset logic 114 (composed of digital logic gates) whose function will be explained subsequently.

To generate square wave train 60, output signal 20 is first passed to a minus 90° phase shifter 116 (for example, built from RC components), producing a phase-shifted sinusoid 70 having the multiplied frequency. Signal 70 is then passed to output wave shaper 118 (also made from a Motorola 1651 clipper), forming a second train of square waves 80, at the multiplied frequency. Square wave train 80 passes to a $2^n$ frequency divider 120 (such as a Fairchild 100136 ECL divide by 16 counter), creating square wave train 60 having the same frequency as the original input sinusoid 10. Square wave train 60 is presented in turn, to both phase error sensor 110 and reset logic 114.

Phase error sensor 110 creates signal 90 which goes to integrating low-pass filter 106. The low-pass filter produces signal 30, which is proportional to the slowly changing phase error this invention desires to stabilize.

To insure that $2^n$ divider 120 "locks on" to the proper rising edge of square wave train 80, reset logic component 114 is introduced. In the event that $2^n$ frequency divider 120 locks on to an incorrect rising edge of the square wave train 80, reset logic 114 will detect a phase error greater than $360/(2^{n+1})$ degrees. In this event, reset logic 114 produces a reset signal 92 which is sent to $2^n$ frequency divider 120 in exact synchronism with the leading edge of the square wave train 40. This arrangement insures that the phase shift between input wave shaper 112 and $2^n$ frequency divider 120 are within an acceptable range.

It is apparent that the apparatus described above provides for a phase-shift stabilized frequency multiplier. It is recognized, of course, that those skilled in the art may make various modifications or additions to the preferred embodiment chosen to illustrate the invention without departing from the spirit and scope of the present contributions to the art. Accordingly, it is to be understood that the protection sought and to be afforded hereby should be deemed to extend to the subject matter claimed and all equivalents thereof fairly within the scope of the invention.

We claim:

1. A static phase shift stabilizer for use with a frequency multiplier adapted to produce a periodic output signal whose frequency is an integral multiple of the frequency of a periodic input signal comprising:

phase error detecting means for producing a phase error signal responsive to the phase difference relationship between the periodic input signal and the periodic output signal; and signal-controlled phase-shifting means, responsive to the phase error signal, for producing a periodic intermediate signal having the same frequency as the periodic input signal and being phase-shifted with respect to the periodic input signal in accordance with the phase error signal, said periodic intermediate signal serving as the input signal presented to the frequency multiplier.

2. A static phase-shift stabilizer for use with a frequency multiplier adapted to produce a periodic output signal whose frequency is an integral multiple of the frequency of a periodic input signal comprising:

phase error detecting means for producing a phase error signal responsive to the phase difference relationship between the periodic input signal and the periodic output signal;

filtering means for filtering the phase error signal and producing a phase control signal; and signal-controlled phase-shifting means, responsive to the phase control signal, for producing a periodic intermediate signal having the same frequency as the periodic input signal and being phase-shifted with respect to the periodic input signal in accordance with the phase error signal, said periodic intermediate signal serving as the input signal presented to the frequency multiplier.

3. The frequency multiplier phase-shift stabilizer according to claim 2, wherein the filtering means is a low-pass filter.

4. A phase-shift stabilized frequency multiplier for producing a periodic output signal having a frequency which is an integral multiple of the frequency of a periodic input signal, comprising:

phase error detector means for producing a phase error signal responsive to the phase difference relationship between the periodic input signal and the frequency-multiplied periodic output signal;

signal-controlled phase-shift means, responsive to said phase error signal, for producing a periodic intermediate signal having the same frequency as said periodic input signal and being phase-shifted with respect to said periodic input signal in accordance with said phase error signal; and frequency multiplication means for multiplying the frequency of said periodic intermediate signal by said integral multiple and producing the periodic output signal.

5. A phase-shift stabilized frequency multiplier for producing a periodic output signal having a frequency which is an integral multiple of the frequency of a periodic input signal, comprising:

phase error detector means for producing a phase error signal responsive to the phase difference relationship between the periodic input signal and the frequency-multiplied periodic output signal;

low-pass filter means for filtering said phase error signal and producing a phase control signal;

signal-controlled phase-shift means, responsive to said phase control signal for producing a periodic intermediate signal having the same frequency as said periodic input signal and being phase-shifted with respect to said periodic input signal in accordance with said phase control signal; and frequency multiplication means for multiplying the frequency of said periodic intermediate signal by said integral multiple and producing the periodic output signal.

6. A static phase-shift stabilizer for use with a frequency multiplier adapted to produce a periodic output signal whose frequency is an integral multiple of the frequency of a periodic input signal, comprising:

manually adjustable phase-shifting means for introducing a phase shift to the periodic input signal and producing a phase-shifted periodic input signal having the same frequency as the periodic input signal;

phase-shifting means for introducing a fixed phase shift to the periodic output signal produced by the frequency multiplier and producing a phase-shifted periodic output signal having the same frequency as the periodic output signal;

means for producing a phase error signal responsive to the phase difference relationship between the phase-shifted periodic input signal and the phase-shifted periodic output signal;

means for filtering the phase error signal and producing a phase control signal; and signal-controlled phase-shift means, responsive to the phase control signal, for producing a periodic intermediate signal having the same frequency as the periodic input signal and being phase-shifted with respect to said periodic input signal in accordance with the phase control signal, the periodic intermediate signal being the input to the frequency multiplier.

7. The static phase-shift stabilizer according to claim 6 wherein said fixed phase shift has a value of minus 90 degrees.

8. The static phase-shift stabilizer according to claim 6 wherein said filtering means is an integrating low-pass filter.

9. A static phase-shift stabilizer for use with a frequency multiplier adapted to produce a periodic output signal whose frequency is an integral multiple of the frequency of a periodic input signal, comprising:

manually adjustable phase-shifting means for introducing a phase shift to the periodic input signal and producing a phase-shifted periodic input signal having the same frequency as the periodic input signal;

phase-shifting means for introducing a fixed phase-shift to the periodic output signal produced by the frequency multiplier and producing a phase-shifted periodic output signal having the same frequency as the periodic output signal;

means for producing a shaped periodic input signal having an amplitude changing relatively quickly with respect to the period of the periodic input signal and in fixed time relationship with predetermined amplitude features of said phase-shifted periodic input signal;

means for producing a shaped periodic output signal having an amplitude changing relatively quickly with respect to the period of the periodic output signal and in fixed time relationship with predetermined amplitude features of said phase-shifted periodic output signal;

means for producing a phase error signal responsive to the phase difference relationship between said shaped periodic input signal and said shaped periodic output signal;

means for filtering the phase error signal and producing a phase control signal; and signal-controlled phase-shift means, responsive to the phase control signal, for producing a periodic intermediate signal having the same frequency as the periodic input signal and being phase-shifted with respect to said periodic input signal in accordance with the phase control signal, the periodic intermediate signal being the input to the frequency multiplier.

10. The static phase-shift stabilizer according to claim 9 wherein said fixed phase shift has a value of minus 90 degrees.

11. The frequency multiplier static phase-shift stabilizer according to claim 9 wherein said filtering means is an integrating low-pass filter.

12. A static phase-shift stabilizer for use with a frequency multiplier M adapted to produce a periodic output signal whose frequency is an integral multiple of the frequency of a periodic input signal;

manually adjustable phase-shifting means for introducing a phase-shift to the periodic input signal and producing a phase-shifted periodic input signal having the same frequency as the periodic input signal;

phase-shifting means for introducing a fixed phase-shift to the periodic output signal produced by the frequency multiplier and producing a phase-shifted periodic output signal having the same frequency as the periodic output signal;

means for producing a shaped periodic input signal having an amplitude changing relatively quickly with respect to the period of the periodic input signal and in fixed time relationship with predetermined amplitude features of said phase-shifted periodic input signal;

means for producing a shaped periodic output signal having an amplitude changing relatively quickly with respect to the period of the periodic output signal and in fixed time relationship with predetermined amplitude features of said phase-shifted periodic frequency-multiplied output signal;

means for dividing the frequency of said shaped periodic output signal by the frequency multiplying factor of M and producing a frequency-divided shaped periodic output signal;

shaped signal phase error detecting means for producing a phase error signal responsive to the phase difference relationship between said shaped periodic input signal and said frequency-divided shaped periodic output signal;

means for filtering the phase error signal and producing a phase control signal; and signal-controlled phase-shifting means, responsive to the phase control signal, for producing a periodic intermediate signal having the same frequency as the periodic input signal and being phase-shifted with respect to said periodic input signal in accordance with the phase control signal, the periodic intermediate signal being the input to the frequency multiplier.

13. The static phase-shift stabilizer according to claim 12 wherein said fixed phase shift has a value of minus 90 degrees.

14. The static phase-shift stabilizer according to claim 12, wherein said filtering means is an integrating low-pass filter.

15. A static phase-shift stabilizer for use with a frequency multiplier M adapted to produce a periodic output signal whose frequency is an integral multiple of the frequency of a periodic input signal, comprising:

manually adjustable phase-shift means for introducing a phase shift to the periodic input signal and producing a phase-shifted periodic input signal having the same frequency as the periodic input signal;

means for introducing a fixed phase shift to the periodic output signal produced by the frequency multiplier and producing a phase-shifted periodic output signal having the same frequency as the periodic output signal;

means for producing a shaped periodic input signal having an amplitude changing relatively quickly with respect to the period of the periodic output signal and sharp edges in fixed time relationship with predetermined amplitude features of said phase-shifted periodic input signal;

means for producing a shaped output signal having an amplitude changing relatively quickly with respect to the period of the periodic output signal and in fixed time relationship with predetermined amplitude features of said phase-shifted periodic frequency-multiplied output signal;

means for dividing the frequency of said shaped periodic output signal by the frequency multiplying factor of M and producing a frequency-divided shaped periodic output signal, said frequency dividing means being resettable by a reset signal to resume dividing the frequency of said shaped output signal with the next-occurring relatively quick amplitude change of said shaped output signal;

resetting logic means for producing the reset signal when the phase difference between the frequency-divided shaped periodic output signal and the shaped periodic input signal exceeds a specified value;

phase error detecting means for producing a phase error signal responsive to the phase difference relationship between said shaped periodic input signal and said frequency-divided shaped periodic output signal;

means for filtering the phase error signal and producing a phase control signal; and signal-controlled phase-shift means, responsive to the phase control signal, for producing a periodic intermediate signal having the same frequency as the periodic input signal and being phase-shifted with respect to said periodic input signal in accordance with the phase control signal, the periodic intermediate signal being the input to the frequency multiplier.

16. The static phase-shift stabilizer according to claim 15 wherein said fixed phase-shift has a value of minus 90 degrees.

17. The static phase-shift stabilizer according to claim 15 wherein said filtering means is an integrating low-pass filter.

18. A static phase-shift stabilizer for use with a frequency multiplier adapted to produce a periodic output signal whose frequency is an integral multiple of the frequency of a periodic input signal, comprising:

manually adjustable phase-shifting means for introducing a phase-shift to the periodic input signal and producing a phase-shifted periodic input signal having the same frequency as the periodic input signal;

means for introducing a minus 90 degree phase-shift to the periodic output signal produced by the frequency multiplier and producing a phase-shifted periodic output signal;

means for producing a square wave input signal with sharp rising edges in synchronism with predetermined amplitude features of said phase-shifted periodic input signal;

means for producing a square wave output signal with sharp rising edges in synchronism with predetermined amplitude features of said phase-shifted frequency-multiplied periodic output signal;

means for dividing the frequency of said square wave output signal by the frequency multiplying factor of M, a power of two, and producing a frequency-divided square wave signal, said frequency dividing means being resettable by a reset signal to resume dividing the frequency of said square wave output signal with the next-occurring sharp rising edge of the square wave output signal;

logic resetting means for producing the reset signal when the phase difference between the frequency-divided square wave output signal and the square wave input signal exceeds a specified value;

phase error detecting means for producing a phase error signal responsive to the phase difference relationship between said square wave input signal and said frequency-divided square wave signal;

low-pass integrating filtering means for filtering said phase error signal and producing a phase control signal; and signal-controlled phase-shifting means, responsive to said phase control signal, for producing the intermediate periodic signal having the same frequency as the periodic input signal and being phase-shifted with respect to the periodic input signal in accordance with the phase control signal.

19. The static phase-shift stabilizer according to claim 18 wherein said periodic signals are sinusoidal signals and all said predetermined amplitude features are positive-going zero crossings.

20. A phase-shift stabilized frequency multiplier for producing a periodic output signal having a frequency which is an integral multiple of the frequency of a periodic input signal, comprising:

manually adjustable phase-shifting means for introducing a phase-shift to the periodic input signal and producing a phase-shifted periodic input signal having the same frequency as the periodic input signal;

means for introducing a minus 90° phase-shift to the periodic output signal and producing a phase-shifted periodic output signal;

means for producing a square wave input signal with sharp rising edges in synchronism with predetermined amplitude features of said phase-shifted periodic input signal;

means for producing a square wave output signal with sharp rising edges in synchronism with predetermined amplitude features of said phase-shifted periodic output signal;

means for dividing the frequency of said square wave output signal by the frequency multiplying factor of M, a power of 2, and producing a frequency-divided square wave signal, said frequency dividing means being resettable by a reset signal to resume dividing the frequency of said square wave output signal with the next-occurring sharp rising edge of the square wave output signal;

logic resetting means for producing the reset signal when the phase difference between the frequency-divided square wave output signal and the square wave input signal exceeds a specified value;

phase error detecting means for producing a phase error signal responsive to the phase difference relationship between said square wave input signal and said frequency-divided square wave signal;

low-pass integrating filtering means for filtering said phase error signal and producing a phase control signal;

signal-controlled phase-shift means, responsive to said phase control signal, for producing an intermediate periodic signal having the same frequency as the periodic input signal and being phase-shifted with respect to the periodic input signal in accordance with the phase control signal; and frequency multiplication means for multiplying the frequency of said periodic intermediate signal by said multiplying factor of M, a power of 2, and producing the periodic output signal.

21. The static phase-shift stabilizer according to claim 20 wherein said periodic signals are sinusoidal signals and all said predetermined amplitude features are positive-going zero crossings.

* * * * *